(12) United States Patent
Fukuda et al.

(10) Patent No.: US 7,750,757 B2
(45) Date of Patent: Jul. 6, 2010

(54) MATCHING CIRCUIT

(75) Inventors: Atsushi Fukuda, Yokohama (JP);
Hiroshi Okazaki, Yokosuka (JP);
Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 0 days.

(21) Appl. No.: 12/405,891

(22) Filed: Mar. 17, 2009

(65) Prior Publication Data
US 2009/0179711 A1    Jul. 16, 2009

Related U.S. Application Data

(62) Division of application No. 11/434,889, filed on May 17, 2006, now abandoned.

(30) Foreign Application Priority Data

May 20, 2005    (JP) .............................. 2005-148621

(51) Int. Cl.
*H03H 7/38*    (2006.01)
(52) U.S. Cl. ........................................ 333/32
(58) Field of Classification Search .................. 333/32, 333/33
See application file for complete search history.

(56) References Cited

U.S. PATENT DOCUMENTS 5,786,737 A    7/1998    Goto

2007/0018758 A1    1/2007    Fukuda et al.

FOREIGN PATENT DOCUMENTS

JP    6-232657    8/1994
WO    WO 2004/082138 A1    9/2004

OTHER PUBLICATIONS

Koji Chiba, et al., "Mobile Terminals", NTT DoCoMo Technical Journal, vol. 4, No. 1, Apr. 1, 2002, pp. 15-20 (with English Translation and in the specification the title is written as "Mobile Handsets").

*Primary Examiner*—Stephen E Jones
(74) *Attorney, Agent, or Firm*—Oblon, Spivak, McClelland, Maier & Neustadt, L.L.P.

(57) ABSTRACT

The present invention has for its object to provide a matching circuit with multiband capability which can be reduced in size, even if the number of handled frequency bands rises. The matching circuit of the present invention comprises a load having frequency-dependent characteristics, a first matching block connected with one end to the load with frequency-dependent characteristics, and a second matching block formed by lumped elements connected in series to the first matching block. And then, when a certain frequency band is used, matching is obtained with the series impedance of the first matching block and the second matching block. When a separate frequency band is used, a π-type circuit is constituted by connecting auxiliary matching blocks to both sides of the second matching block. Next, at the same frequency, by taking the combined impedance of this π-type circuit and a load whose characteristics do not depend on the frequency to be Z0, the influence of the second matching block is removed.

3 Claims, 17 Drawing Sheets

MATCHING CIRCUIT

CROSS REFERENCE TO RELATED APPLICATION

This application is a divisional and claims the benefit of priority under 35 U.S.C. §120 from U.S. application Ser. No. 11/434,889, filed May 17, 2006, now abandoned the entire content of which is incorporated herein by reference, and claims the benefit of priority under 35 U.S.C. §119 of Japanese Patent Application No. 2005-148621, filed May 20, 2005.

BACKGROUND OF THE INVENTION

1. Field of the invention

This invention pertains to a matching circuit handling multiple bands which, in a plurality of frequency bands, establishes matching between circuits having different impedances. It pertains to matching circuits built into small-sized multiband power amplifiers which amplify, with high efficiency, signals in a plurality of frequency bands used e.g. in mobile communications and satellite communications.

2. Description of Related Art

Accompanying the diversification of services offered by means of radio communications, conversion to multiband capability for processing signals in a plurality of frequency bands is required of radio equipment. As an indispensable device included in radio equipment, there is the power amplifier. In order to carry out efficient amplification, there is a need to obtain impedance matching between the amplification element and its peripheral circuits, so a matching circuit is used. As an example of a conventional multiband power amplifier, technology as shown in Reference 1 (NTT DoCoMo Technical Journal, Vol. 10, No. 1: "Mobile Handsets") is disclosed.

The configuration of the 800 MHz/2 GHz band power amplifier shown in Reference 1 is shown in FIG. 1, and the operation thereof will be explained. The transmitted signal coming from the transmitter is input into the single pole terminal of an input switch 150, a Single Pole Double Throw (SPDT) switch. Next, the transmitted signal, by being switched by input switch 150, is input into an 800 MHz band amplifier 151 connected to a double throw terminal of input switch 150, or a 2 GHz band amplifier 152. The output signals of 800 MHz band amplifier 151 and 2 GHz band amplifier 152 are switched by an output switch 153, a Single Pole Double Throw switch, and supplied to an antenna.

In FIG. 2, the configuration of 800 MHz band amplifier 151 and 2 GHz band amplifier 152 is shown. Each amplifier is configured with a series connection of an input matching circuit 160, an amplification element 161, and an output matching circuit 162. Input matching circuit 160 obtains matching between a signal source 163, whose output impedance does not depend on the frequency, and amplification element 161. Output matching circuit 162 obtains matching between the output impedance of amplification element 161 and a load 164.

Since the input impedance of amplification element 161 constituting each amplifier varies with frequency, input matching circuit 160 and output matching circuit 162 are different depending on the operation frequencies, even if the same amplification element 161 is used. Accordingly, as shown in FIG. 1, separate amplifiers 151, 152 handling each frequency band have been necessary. Consequently, there has been the problem that the total circuit area of the transmitter became larger as the operating frequency bands rose.

In order not to increase the circuit area of an amplifier, the method of designing matching circuits for wideband operation can also be considered. However, compared to matching circuits designed for narrowband operation, the result is that there occurs a reduction in gain and efficiency. Accordingly, with respect to these problems, the applicant of the present application first proposed, in Reference 2 (International Publication No. WO 2004/082138 Pamphlet), a matching circuit which can handle the conversion to multiband capability. The input matching circuit of the amplifier disclosed in Reference 2 is shown in FIG. 3. E.g., the FET (Field Effect Transistor) input impedance can be expressed as a load 170 (impedance $Z_L(f)$) having frequency-dependent characteristics. A first terminal P1 to which this load 170 is connected has a main matching block 171 connected to it. The other end (point A) of main matching block 171 is connected to one end of a delay circuit 172 having a certain reactance value. The other end (point B) of delay circuit 172 is connected to a signal source 173 having an impedance Z0 (below, the impedance not changing with frequency is called Z0).

Main matching block 171 is designed to match the impedance $Z_L(f1)$ of load 170 with the impedance Z0 of signal source 173, in frequency band f1. In other words, main matching block 171 becomes a matching circuit with respect to frequency f1. Delay circuit 172 is constituted by a distributed-parameter element, the characteristic impedance of which is given, as is well known, by the relationship shown in Eq. 1.

$$Z0 = \sqrt{L/C} \tag{1}$$

Here, L is the inductance of the distributed-parameter element and C is the capacitance of the distributed-parameter element. Consequently, by taking the characteristic impedance of delay circuit 172 to be Z0, matching is obtained in frequency band f1 between signal source 173 and load 170.

When operating in a frequency band f2, different from frequency band f1 (e.g. when frequency band f2 is lower than frequency band f1), the impedance of load 170 changes to $Z_L(f2)$. Also, since main matching block 171 is a matching circuit with respect to frequency f1, matching between signal source 173 and load 170 is not obtained at frequency f2. Accordingly, an auxiliary matching block 175 is connected via switch element 174 to point B. And then, when operating in frequency band f2, switch element 174 is taken to be in a conducting state. By choosing a configuration like this, it is possible, whichever is the value of the impedance estimated from point A toward the side of load 170, to make the impedance Z0, seen from point B toward the side of delay circuit 172. Here, the delay value of delay circuit 172 is set to the delay value required to match at point B in frequency band f2.

With the same approach as for the matching circuit shown in FIG. 3, an example where the number of frequency bands which can be handled has been increased to three is shown in FIG. 4. By the fact that the number of frequency bands has increased from two to three, the system increases by one additional set, the set of delay circuit 180, switch element 181, and auxiliary matching block 182. In a third frequency band f3, the impedance $Z_L(f3)$ of load 170 is regulated by means of delay circuit 180 and auxiliary matching block 182 so that the impedance seen from point C toward the side of delay circuit 180 becomes Z0. Further, since the characteristic impedances of the delay circuits are fixed and do not depend on the frequency, it is possible to obtain matching between signal source 173 and load 170 in each frequency band if switch element 174 and switch element 181 are chosen to be in a non-conducting state in the case of frequency band f1, switch element 174 is chosen to be in a conducting state for in the case of frequency band f2, and switch element 181 is chosen to be in a conducting state in the case of frequency band f3.

In this way, by providing auxiliary matching blocks connected via switch elements between the delay circuits along with connecting in series in multiple stages delay circuits whose impedances do not vary with frequency, there is implemented a matching circuit capable of matching with respect to a plurality of frequency bands. Further, the delay value required in frequency band f3 can be considered to be the sum of the values for delay circuit 172 and delay circuit 180.

As for delay circuits 172 and 180, it is realistic to choose them to be transmission lines which are distributed parameter networks. However, particularly in cases where the frequency is low, transmission lines become comparatively large components inside the circuit. E.g., if load 170 is taken to be a FET and in case an amplifier for the 1 GHz band is designed, a 50 Ω transmission line has a width of 0.63 mm and a length of 9.22 mm, so the result is a component having a length of about 10 mm.

In the technology shown in the aforementioned Reference 2, the delay circuits are realistically constituted by transmission lines. However, in the case of transmission lines, the length easily becomes comparatively long. In particular, in the case where the used frequency is low, the area of a transmission line serving as a delay circuit becomes large, so there has been the problem that the matching circuit as a whole also was made bigger. Further, this problem increases as the frequency becomes lower, and as the number of frequencies rises.

BRIEF SUMMARY OF THE INVENTION

The matching circuit of the present invention has a first matching block, connected at one end to a load having an impedance with frequency-dependent characteristics and a second matching block formed by a lumped-parameter element connected in series to the first matching block. E.g., the second matching block matches the impedances of the signal source and the load in the lowest frequency band. Moreover, for the purpose of impedance matching in high frequency bands, it has a π-type circuit. A π-type circuit is a circuit in which respective switch elements and auxiliary matching blocks are connected to both ends of the second matching block.

According to a configuration like this, the matching conditions in the aforementioned low frequency band can be created by a series connection of the first matching block and the second matching block. Further, in the case of a high frequency band, by setting an appropriate value for the π-type circuit, it is possible to choose the impedance of the π-type circuit to be Z0 and to choose the impedance of the second matching block to be one with no influence for the high frequency band. Moreover, since the second matching block is constituted by lumped elements, it is possible to make the matching circuit smaller-sized than the conventional matching circuit constituted by transmission lines.

DETAILED DESCRIPTION OF THE INVENTION

Embodiment 1

Figure 5:
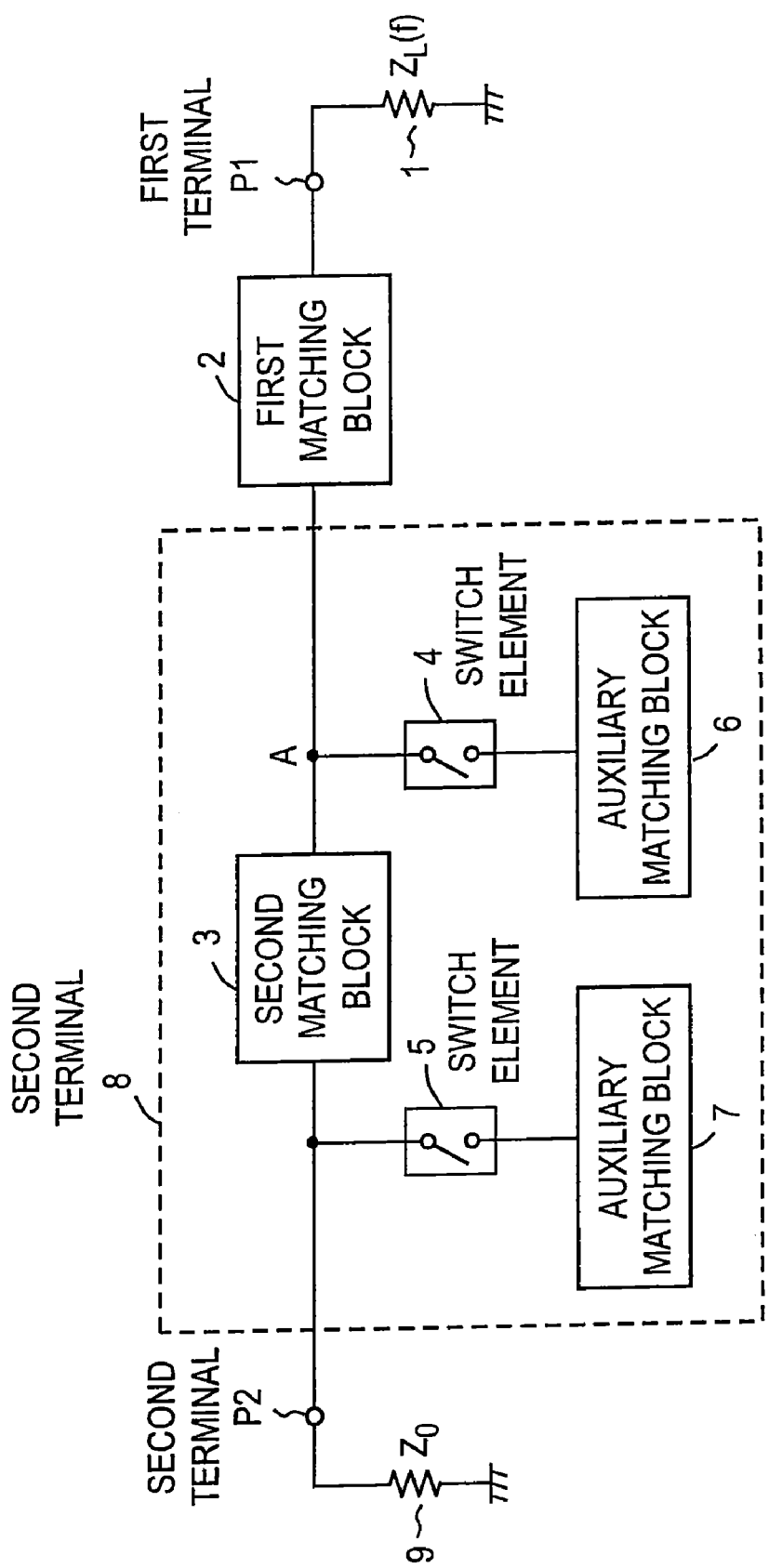
FIG. 5 is a diagram showing the base configuration of a matching circuit of this invention.

In FIG. 5, the basic configuration of a matching circuit of the present invention is shown. The matching circuit of the present invention is constituted by a first matching block 2 and a matching circuit part 8 consisting of lumped elements. Matching circuit part 8 is a π-type circuit constituted by a second matching block 3, switch elements 4 and 5, and auxiliary matching blocks 6 and 7. One end of first matching block 2 is connected to a first terminal P1 to which an element 1 (a load in this example) having an impedance $Z_L(f)$ with frequency-dependent characteristics is connected. To the other end of first matching block 2, one end of second matching block 3 is connected in series. The other end of second matching block 3 is connected, via a second terminal P2, to an element 9, e.g. a signal source, with an impedance Z0 whose impedance does not depend on the frequency. Also, to the terminal on the first matching block 2 side of second matching block 3, there is connected a series circuit of switch element 4 and auxiliary matching block 6. To the other end of second matching block 3, there is connected a series circuit of switch element 5 and auxiliary matching block 7. By being connected in this way, matching circuit part 8 becomes a π-type circuit.

Figure 6A:
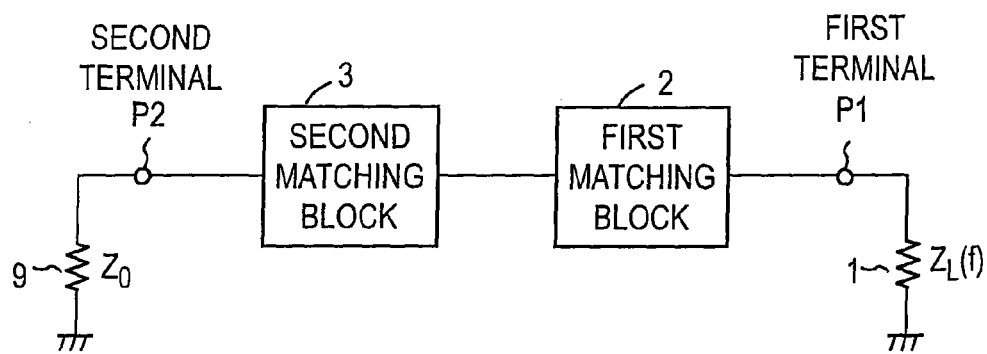
FIG. 6A is a diagram explaining the operation in a low frequency band f2.
Figure 6B:
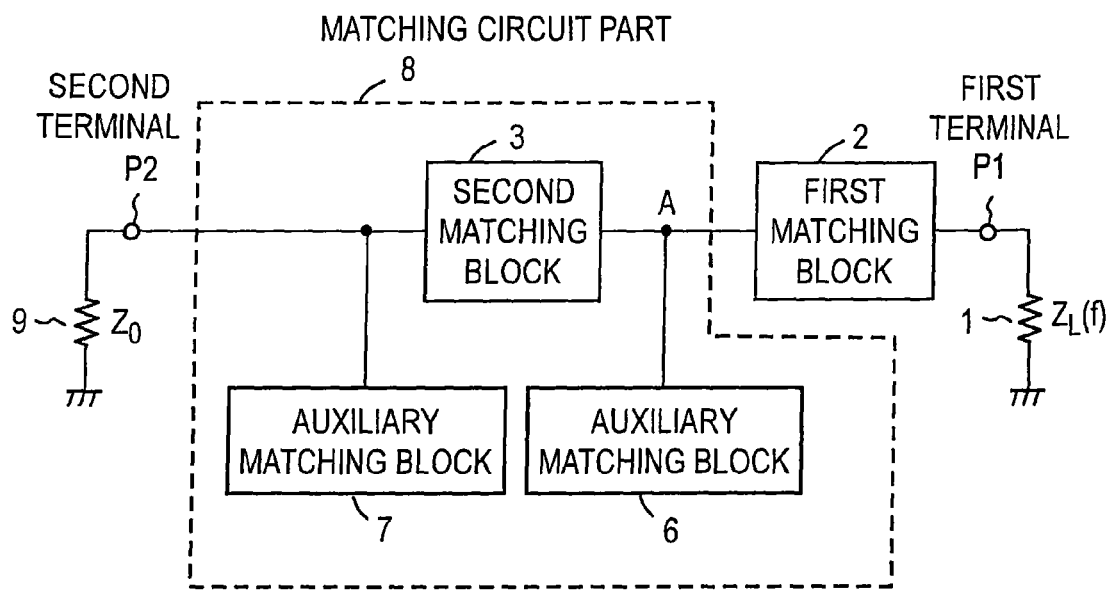
FIG. 6B is a diagram explaining the operation in a high frequency band f1.

The operation of the matching circuit in FIG. 5 will be explained using FIG. 6A and FIG. 6B. FIG. 6A is a diagram showing the operation in a low frequency band f2. FIG. 6B is a diagram showing the operation in a high frequency band f1. In the case of frequency band f2, switch elements 4 and 5 of FIG. 5 are non-conducting. Consequently, in the case of frequency band f2, impedance Z2 of the second matching block is set so that the sum $Z_A$ of impedance $Z_L(f2)$ of element 1 in the frequency band f2, impedance Z1 of first matching block 2, and impedance Z2 of second matching block 3 (below, the impedances will be omitted in portions where the same can be considered not to be particularly necessary) becomes Z0. As a result, the impedances are matched at second terminal P2.

In the frequency band f1, switch elements 4 and 5 in FIG. 5 are in a conducting state. Consequently, as shown in FIG. 6B, matching circuit 8 becomes a π-type circuit in which auxiliary matching blocks 6 and 7 are respectively connected to both ends of second matching block 3. Here, since first matching block 2 is a matching circuit for the frequency band f1, impedance matching is obtained with impedance Z0 of element 9 at point A at frequency f1. Accordingly, by making a design so that, in the frequency band f1, the combined impedance Zπ seen from point A toward the second terminal P2 side becomes identical to Z0 (Z0=Zπ, it is possible to remove the influence of the impedance of second matching block 3 in the frequency band f1. Specifically, if the impedance of auxiliary matching block 6 is taken to be Z3 and the impedance of auxiliary matching block 7 is taken to be Z4, Z3 and Z4 may be designed so that the condition shown in Eq. 2 is met.

$$Z\pi=(Z0Z2Z3+Z4Z2Z3+Z0Z4Z3)/(Z0Z4+Z0Z2+Z0Z3+Z4Z2+Z1Z3) \quad (2)$$

As was stated above, in the frequency band f1, it is first matching block 2 which operates to match impedance $Z_L(f1)$ of element 1 to impedance Z0 of element 9. Also, it is second matching block 3 which operates to match the impedance $Z_L(f2)$ of element 1, changed by the modification of the frequency band from f1 to f2, to the impedance Z0 of element 9. Further, it is auxiliary matching blocks 6 and 7 which operate to remove the influence of second matching block 3 which is a hindrance in frequency band f1.

Figure 7:
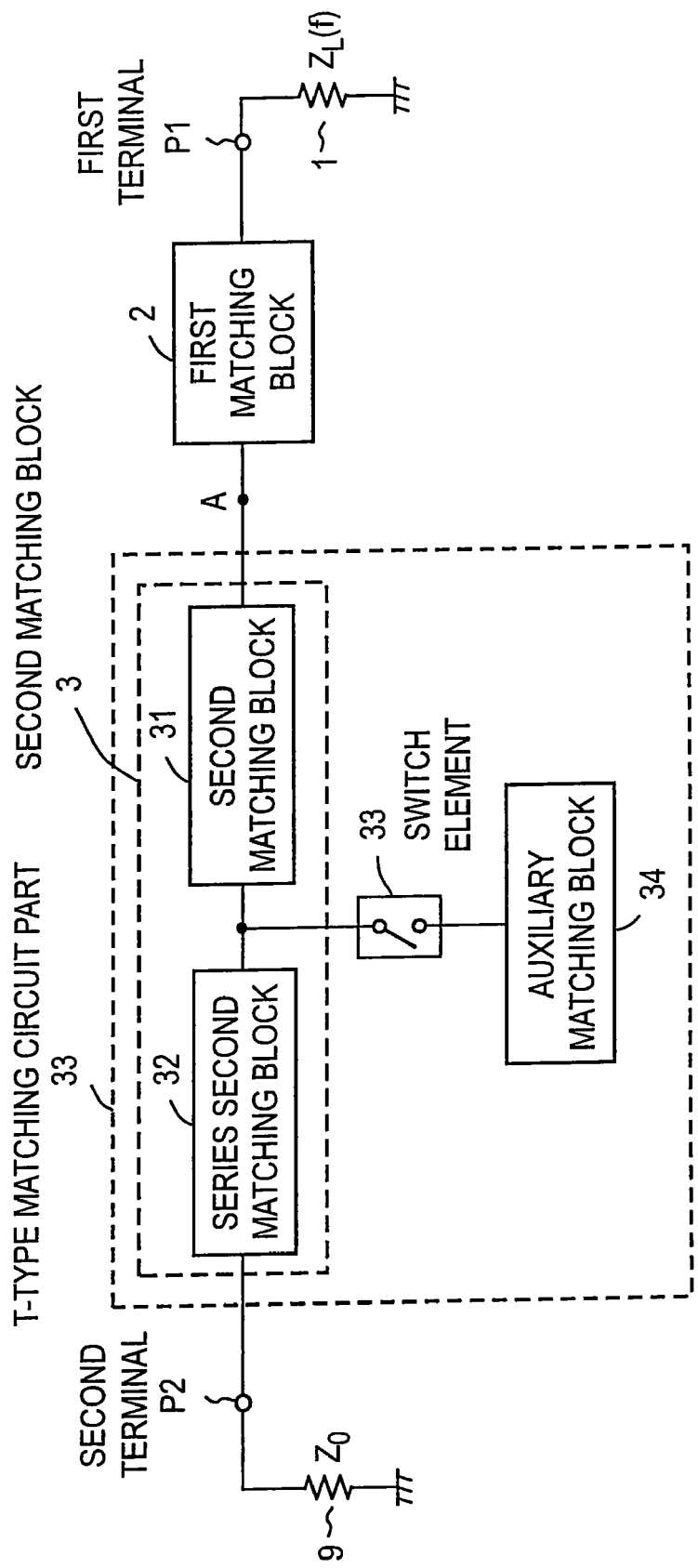
FIG. 7 is a diagram showing the configuration where the π-type circuit of a matching circuit of this invention, shown in FIG. 5, has been replaced with a T-type circuit.

Matching circuit part 8 in FIG. 5 can also be configured with a T-type circuit. An example where the matching circuit part has been configured with a T-type circuit is shown in FIG. 7. In FIG. 7, second matching block 3 in FIG. 5 is replaced by a second matching block 31 and a series second matching block 32. One end of second matching block 31 is connected to point A. The other end of second matching block 31 is connected to one end of series second matching block 32. The other end of series second matching block 32 is connected to second terminal P2. To the connection point of second matching block 31 and series second matching block 32, there is connected an auxiliary matching block 34 via a switching element 33.

The relationship between FIG. 5 and FIG. 7 cannot be converted with the well known Y–Δ conversion (T-π conversion) relationship. In order to adopt a matching circuit equivalent to that of FIG. 5, first, the value of the impedance of second matching block 3 must be Z2 as a condition in frequency band f2. Consequently, if the impedance of second matching block 31 is taken to be Za and the impedance of series second matching block 32 is taken to be Zb, the relationship Z2=Za+Zb must be satisfied. In order to choose a T-type circuit which is equivalent to a π-type circuit, the impedance value of auxiliary matching block 34 may be designed by adding this condition. Of course, it goes without saying that matching block part 8 may be designed with a T-type circuit from the beginning. In this way, it is possible for matching circuit part 8 to have a configuration which is not limited to a π-type circuit but can also be a T-type circuit.

Embodiment 2

Figure 8:
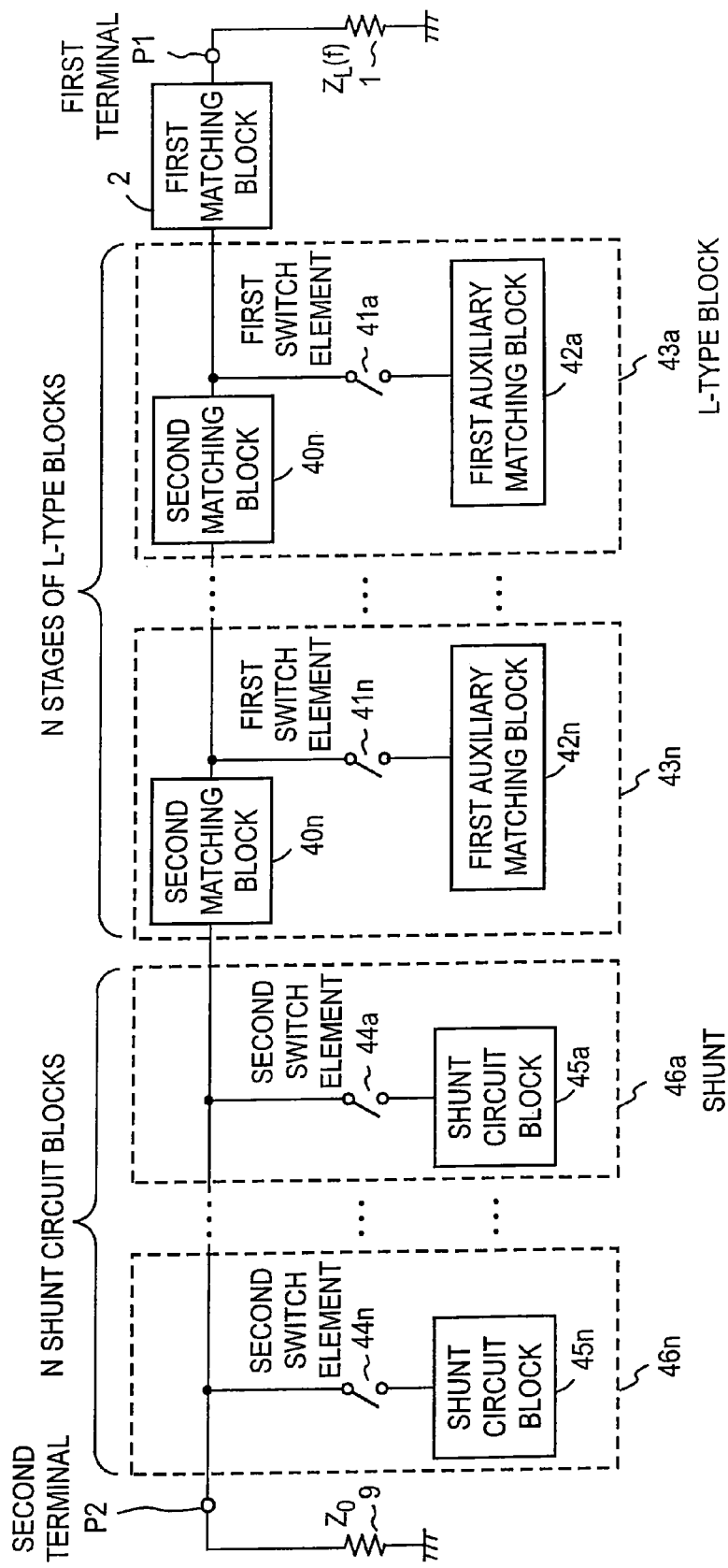
FIG. 8 is a diagram where the matching circuit of the present invention, shown in FIG. 5, has been generalized so that it can be adapted to a plurality of frequency bands.

FIG. 8 is an example where the basic structure of this invention, shown in FIG. 5, has been generalized so that it can be adapted to a plurality of frequency bands. This matching circuit is composed of first matching block 2, L-type blocks 43a to 43n, and shunt circuit blocks 46a to 46n. Each L-type block 43i (i=a to n) is composed of a second matching block 40i, a first switch element 41i, and a first auxiliary matching block 42i. One terminal of second matching block 40a is connected to first matching block 2. Also, the other end of second matching block 40a is connected to one terminal of second matching block 40b. In this way, each second matching block 40i is connected in series. First auxiliary matching block 42i is connected, via first switch element 41i, to the terminal of second matching block 40i on the side of first terminal P1. In other words, an L-type circuit is formed by means of second matching block 40i, first switch element 41i, and first auxiliary matching block 42i.

To the second terminal P2 side of L-type block 43n, there are connected in parallel shunt circuit blocks 46a to 46n. Each shunt circuit block 46i (i=a to n) is composed of a second switch element 44i connected in series and a second auxiliary matching block 45i.

Below, an explanation will be given on the operation and design method of a matching circuit in which three L-type blocks 43a to 43c and three shunt circuit blocks 46a to 46c are connected.

First, an explanation will be given for the case of frequency band f4. In the case of frequency band f4, first switch elements 41a to 41c and second switch elements 44a to 44c are all in a non-conducting state. Element 1 (impedance $Z_L(f4)$) is connected, via three second matching blocks 40a to 40c connected in series, to element 9 (impedance Z0). Here, the impedance $Z_L(f)$ of element 1 changes with frequency. Also, element 9 is a signal source or the like, the impedance of which does not depend on the frequency. Here, second matching block 40c is designed so that the combined impedance of element 1, first matching block 2, and second matching blocks 40a and 40b is converted to Z0. If second matching block 40c is designed in this way, the impedance Z0 is matched at the second terminal P2 side end of second matching block 40c.

In the case of frequency band f3, switch element 41c of L-type block 43c and second switch element 44a of shunt circuit block 46a are chosen to be in a conducting state. In this case, since first auxiliary matching block 42c and second auxiliary matching block 45a are connected to both ends of second matching block 40c, a π-type circuit is configured. Here, second matching block 40b is designed so that the combined impedance due to element 1 (impedance $Z_L(f3)$), first matching block 2, and second matching block 40a is matched to Z0. If second matching block 40b is designed in this way, the impedance seen from the second terminal P2 side of second matching block 40b (the first terminal P1 side of second matching block 40c) toward element 1 becomes Z0. Also, first auxiliary matching block 42c and second auxiliary matching block 45a are designed so that Eq. 2 is satisfied at frequency f3. By designing in that way, the impedance seen from the first terminal P1 side of second matching block 40c (the second terminal P2 side of second matching block 40b) toward element 9 also becomes Z0. In other words, it is possible to remove the influence of the impedance of second matching block 40c, so the impedances are matched.

In the case of frequency band f2, switch element 41b of L-type block 43b and second switch element 44b of shunt circuit block 46b are chosen to be in a conducting state. In this case, since first auxiliary matching block 42b and second auxiliary matching block 45b are connected to both ends, connected in series, of second matching block 40c and second matching block 40b, a π-type circuit is configured. Second matching block 40a is designed so that the combined impedance due to element 1 (impedance $Z_L$(f2)) and first matching block 2 is matched to Z0. If second matching block 40a is designed in this way, the impedance seen from the second terminal P2 side of second matching block 40a (the first terminal P1 side of second matching block 40b) toward element 1 becomes Z0. Also, first auxiliary matching block 42b and second auxiliary matching block 45b are designed so that Eq. 2 is satisfied at frequency f2. By designing in that way, the impedance seen from the first terminal P1 side of second matching block 40b (the second terminal P2 side of second matching block 40a) toward element 9 also becomes Z0. In other words, it is possible to remove the influence of second matching blocks 40b and 40c, so the impedances are matched.

In the case of frequency band f1, switch element 41a of L-type block 43a and second switch element 44c of shunt circuit block 46c are in a conducting state. In this case, since first auxiliary matching block 42a and second auxiliary matching block 45c are connected to both ends of second matching blocks 40c to 40a, a π-type circuit is configured. First matching block 2 is designed so that impedance $Z_L$(f1) of element 1 is matched to Z0. If first matching block 2 is designed in this way, the impedance seen from the second terminal P2 side of first matching block 2 (the first terminal P1 side of second matching block 40a) toward element 1 becomes Z0. Also, first auxiliary matching block 42a and second auxiliary matching block 45c are designed so that Eq. 2 is satisfied at frequency f1. By designing in that way, the impedance seen from the first terminal P1 side of second matching block 40a (the second terminal P2 side of first matching block 2) toward element 9 also becomes Z0. In other words, it is possible to remove the influence of the impedances of second matching blocks 40a to 40c, so the impedances are matched.

As stated above, it is possible to combine three L-type blocks and shunt circuits to match the impedances at four frequencies. If this is generalized, the result is that it is possible, with a combination of N L-type blocks and shunt circuits, to match the impedances in N+1 frequency bands.

Figure 9:
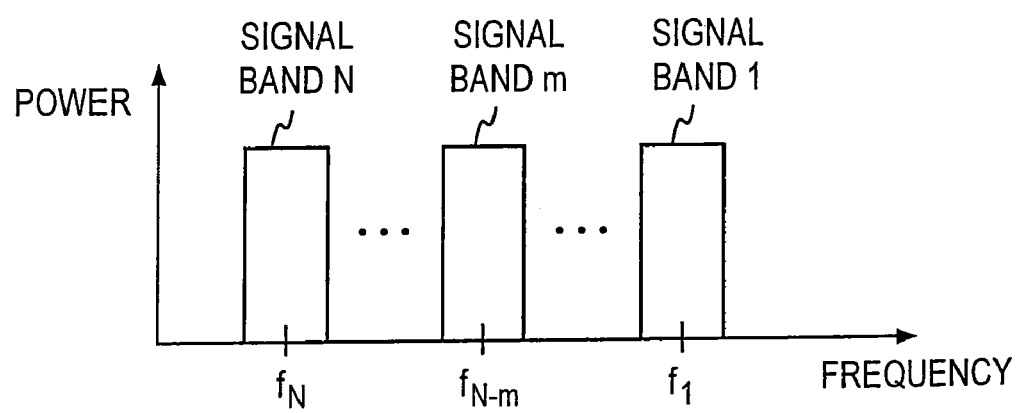
FIG. 9 is a diagram showing the image of N frequency bands.

FIG. 9 expresses the image of N frequency bands. The abscissa axis of FIG. 9 is the frequency and the ordinate axis is the power of transmission. In this diagram, a relation that the frequency becomes lower as N increases is shown as an example.

Further, in FIG. 8, the frequencies are arranged in the order corresponding to shunt circuit blocks 46a to 46n. However, as long as a one-to-one relationship with first auxiliary matching blocks 42a to 42n is satisfied, the order of arranging shunt circuit blocks 46a to 46n is indifferent.

Also, the second matching block is configured with lumped elements connected in series between the conductively connected first switch element and second switch element. Consequently, even if the number of second matching blocks becomes large, it is possible to make the whole circuit remarkably small, compared to the case of a configuration with transmission lines.

Embodiment 3

Figure 10:
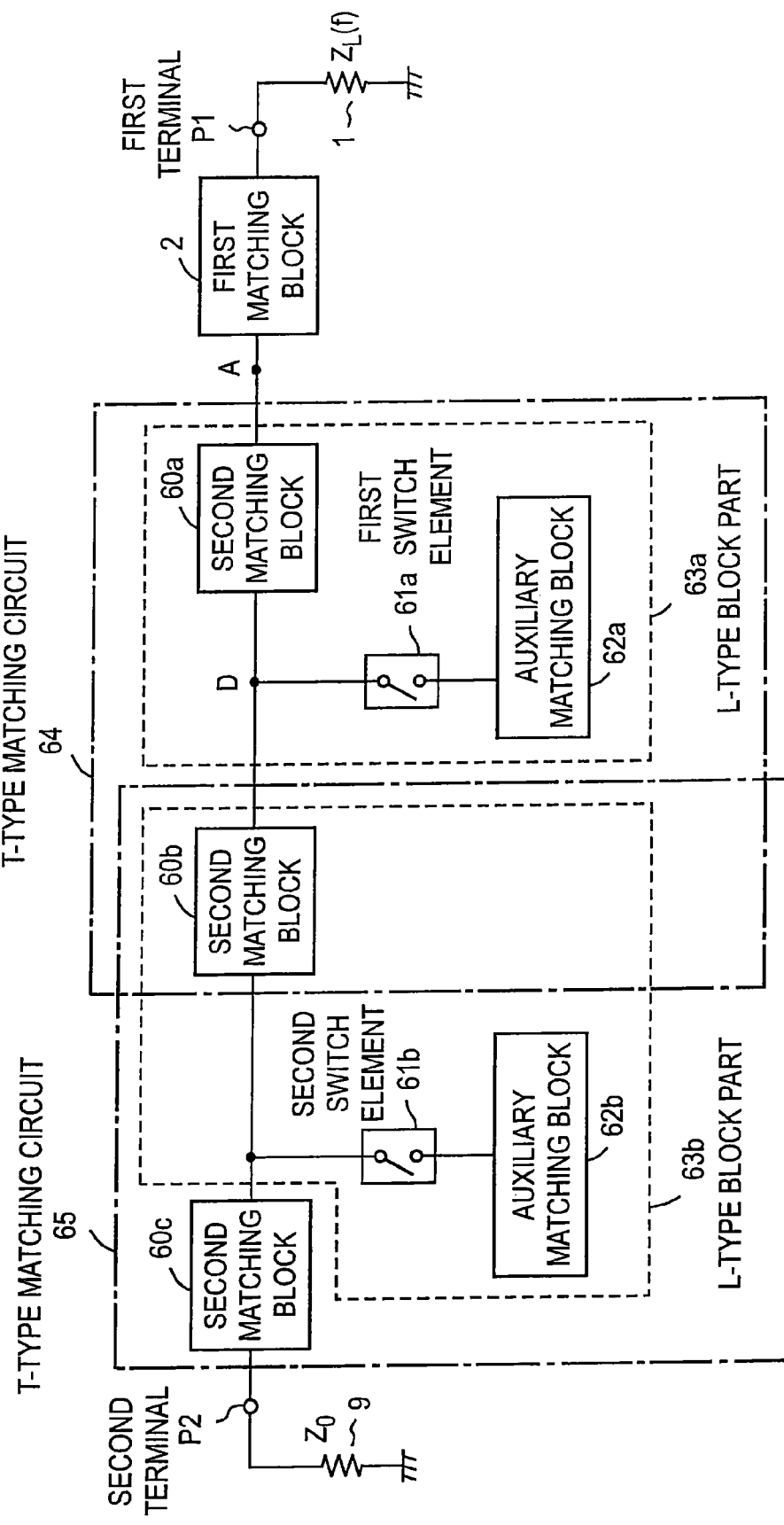
FIG. 10 is a diagram showing an embodiment of a matching circuit using two T-type circuits.

A matching circuit generalized by using π-type circuits was explained in FIG. 8, but it is also possible to configure a generalized matching circuit using T-type circuits. In FIG. 10, there is shown an embodiment of a matching circuit using two T-type circuits. This matching circuit is composed of first matching block 2, an L-type block part 63a, an L-type block part 63b, and a second matching block 60c. One end of first matching block 2 is connected to a first terminal P1 at which it is connected to element 1. Also, the other end of first matching block 2 is connected to one end of a second matching block 60a inside L-type block part 63a. To the other end of second matching block 60a, there is connected an auxiliary matching block 62a via a first switch element 61a. Moreover, the other end of second matching block 60a is also connected to one end of a second matching block 60b inside L-type block part 63b. To the other end of second matching block 60b, an auxiliary matching block 62b is connected via a second switch element 61b. In addition, the other end of second matching block 60b is also connected to one end of second matching block 60c. Here, L-type block part 63a is composed of second matching block 60a, first switch element 61a, and auxiliary matching block 62a. Also, L-type block part 63b is composed of second matching block 60b, second switch element 61b, and auxiliary matching block 62b. Also, T-type matching circuits 64 and 65 are composed of two L-type block parts 63a and 63b and one second matching block 60c. T-type matching circuit 64 is composed of second matching blocks 60a and 60b, first switch element 61a, and auxiliary block 62a. Also, T-type matching circuit 65 is composed of second matching blocks 60c and 60b, second switch element 61b, and auxiliary matching block 62b. In this way, a matching circuit which matches impedances in three frequency bands is configured in two stages with T-type matching circuits 64 and 65.

In the case of frequency band f3, switch elements 61a and 61b are chosen to be in a non-conducting state. The impedance of element 1 changes with the frequency band. Element 1 with an impedance $Z_L$(f3) is connected, via the serially connected first matching block 2 and second matching blocks 60a, 60b, and 60c, to element 9 which has an impedance of Z0.

Second matching block 60b and second matching block 60c are designed so that the combined impedance with element 1, first matching block 2, and second matching block 60a becomes Z0. By designing second matching block 60b and second matching block 60c in this way, it is possible to match the impedances at second terminal P2 of second matching block 60c.

In the case of frequency band f2, switch element 61b constituting T-type matching circuit 65 is in a conducting state. Second matching block 60a is designed so that the combined impedance with element 1, having an impedance $Z_L$(f2), and first matching block 2 is taken to be Z0. By designing second matching block 60a in this way, the impedance seen from point D toward element 1 becomes Z0. Also, auxiliary matching block 62b is designed so that the combined impedance of second matching blocks 60b and 60c, auxiliary matching block 62b, and element 9 becomes Z0. If auxiliary matching block 62b is designed in this way, the impedance seen from point D toward the element 9 side becomes Z0. Consequently, it is possible to match the impedances at point D. Also, even on the side of second terminal P2, the impedance seen toward element 1 is Z0.

Consequently, the combined impedance of second matching blocks 60c and 60b and auxiliary matching block 62b does not exert any influence on the matching condition. In other words, auxiliary matching block 62b removes the influence of second matching blocks 60c and 60b at frequency f2.

In the case of frequency band f1, switch element 61b constituting T-type matching circuit 65 is in a non-conducting state, and switch element 61a constituting T-type matching circuit 64 is in a conducting state. First matching block 2 is designed so that the the combined impedance with impedance $Z_L(f1)$ of element 1 becomes Z0. By designing first matching block 2 in this way, the impedance seen from point A toward element 1 becomes Z0. Next, first auxiliary matching block 62a is designed so that the combined impedance of second matching blocks 60a, 60b, and 60c, auxiliary matching block 62a, and element 9 becomes Z0. By designing first auxiliary matching block 62a in this way, the impedance seen from point A toward element 9 becomes Z0. Consequently, it is possible to obtain matching of the impedances at point A. Also, on the second terminal P2 side as well, the impedance seen toward element 1 is Z0. Consequently, the combined impedance of second matching blocks 60a, 60b, 60c and auxiliary matching block 62a does not exert influence any more on the matching conditions. In other words, auxiliary matching block 62a removes the influence of second matching blocks 60a, 60b, 60c at the frequency f1.

With the aforementioned explanation, the case where switch element 61b is non-conducting was explained. However, it is not mandatory to take switch element 61b to be non-conducting. In case switch element 61b is taken to be conducting when the frequency band is f1, auxiliary matching block 62a may be designed with that assumption.

In this way, it is possible to configure a matching circuit handling three frequency bands by means of two T-type matching circuits 64 and 65.

Embodiment 4

Figure 11:
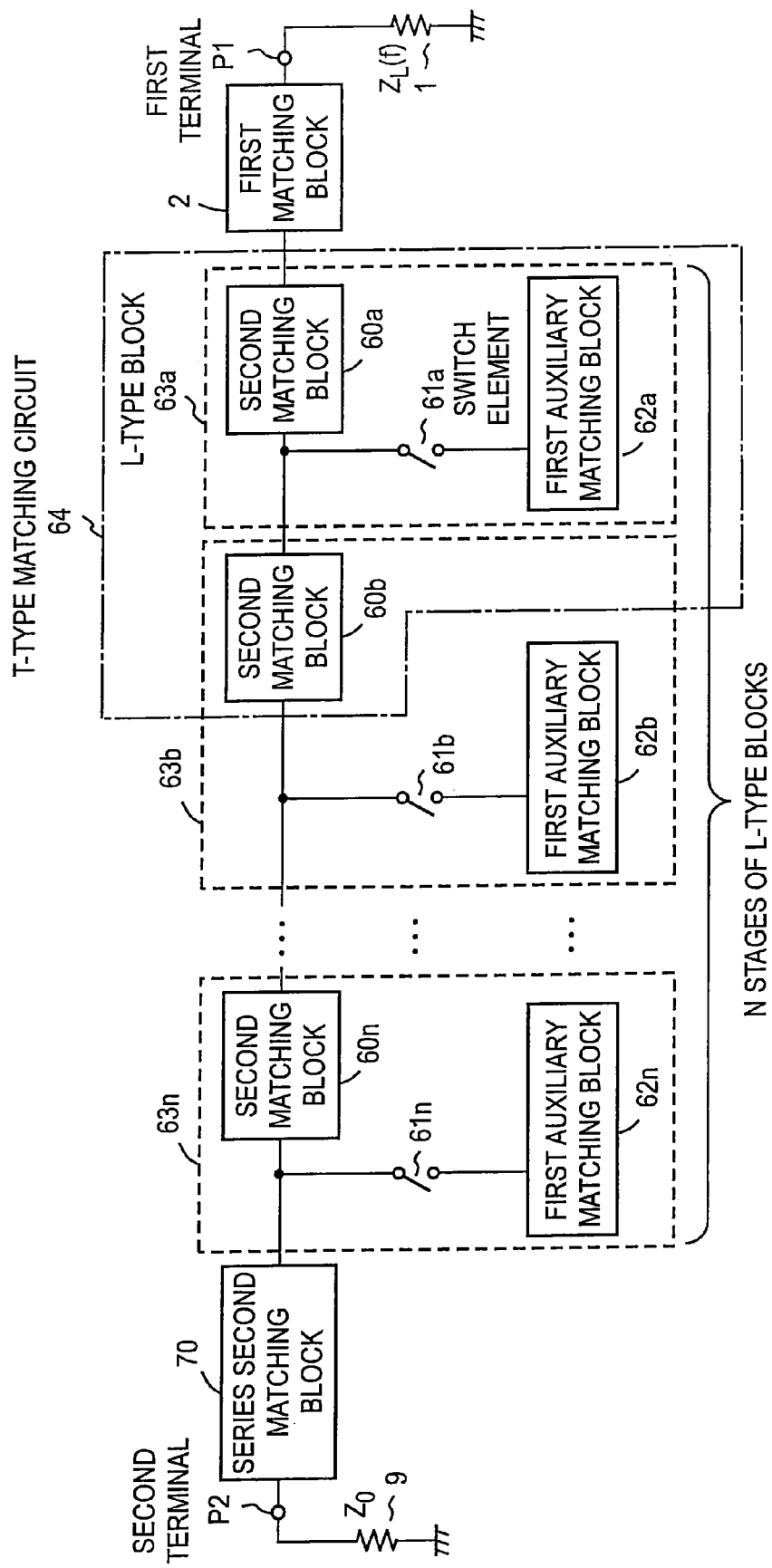
FIG. 11 is a diagram where a matching circuit of the present invention, using T-type matching circuits, has been generalized so that it can be adapted to a plurality of frequency bands.

An example showing a generalization of the T-type matching circuit explained in Embodiment 3 is shown in FIG. 11. The configuration up to the second-stage L-type block 63b seen from first matching block 2 is identical to that of FIG. 10. On the second terminal P2 side of second-stage L-type block 63b, L-type blocks are added. In FIG. 11, a total of N L-type blocks 63a to 63n are connected. To the other end of L-type block 63n, one end of series second matching block 70 is connected, the other end of series second matching block 70 being connected to second terminal P2. N is an integer equal to or greater than 1. The matching circuit shown in FIG. 11 is a subordinate connection configuration of N T-type matching circuits and is capable of matching in N+1 frequency bands. The operation is the same as in FIG. 10.

Embodiment 5

Figure 12:
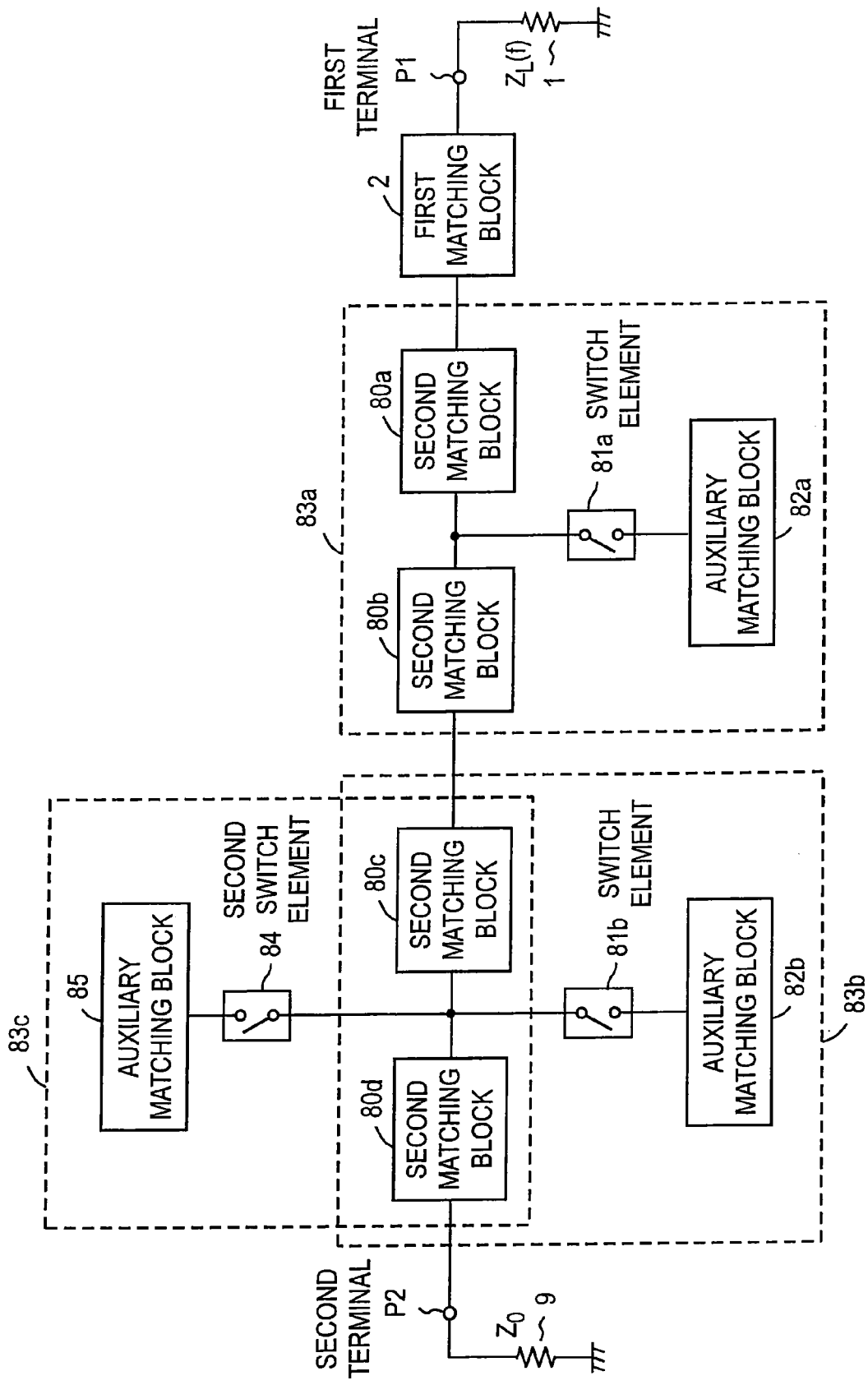
FIG. 12 is a diagram showing another configuration example of a matching circuit of the present invention using T-type matching circuits.

Another T-type matching circuit embodiment is shown in FIG. 12. In FIG. 10, a T-type circuit was formed using second matching blocks of adjacent L-type blocks. FIG. 12 is an example in which a plurality of auxiliary matching blocks are connected, via switch elements, between two second matching blocks connected in series. This matching circuit is composed of first matching block 2 and T-type matching circuits 83a, 83b, and 83c. T-type matching circuit 83a is composed of second matching blocks 80a and 80b, a switch element 81a, and an auxiliary matching block 82a. One end of second matching block 80a is connected to first matching block 2. The other end of second matching block 80a is connected to one end of second matching block 80b. Also, auxiliary matching block 82a is connected, via switch element 81a, between second matching block 80a and second matching block 80b. By this kind of connection relationship, second matching blocks 80a and 80b, switch element 81a, and auxiliary matching block 82a make up a T-type circuit. T-type matching circuit 83b is composed of second matching blocks 80c and 80d, a switching element 81b, and an auxiliary matching block 82b. T-type matching circuit 83c is composed of second matching blocks 80c and 80d, a second switching element 84, and an auxiliary matching block 85. Here, second matching blocks 80c and 80d are constituent parts of both T-type matching circuit 83b and T-type matching circuit 83c. With this configuration, auxiliary matching block 82b is connected, via switch element 81b, to the connection point of second matching block 80c and second matching block 80d. Moreover, auxiliary matching block 85 is also connected, via second switch element 84, to the connection point of second matching block 80c and second matching block 80d. One end of second matching block 80c is connected to second matching block 80b. Also, the other end of second matching block 80d is connected to the second terminal P2 to which element 9 is connected.

As stated above, a T-type matching circuit may be connected in multiple stages between element 1 and element 9. The present embodiment is capable of matching in three frequency bands by means of three T-type matching circuits.

In the case of frequency band f3, switch elements 81a and 81b and second switch element 84 are non-conducting. Second matching blocks 80c and 80d are designed so that the combined impedance with element 1 (impedance $Z_L(f3)$), first matching block 2, and second matching blocks 80a, 80b is made to match the impedance Z0 of element 9 in the frequency band f3. Consequently, impedance matching can be obtained at second terminal P2.

In the case of frequency band f2, it is only switch element 81b forming T-type matching circuit 83b that is conducting. Second matching blocks 80a and 80b are designed so that the combined impedance of element 1 (impedance $Z_L(f2)$) and first matching block 2 is made to match the impedance Z0 of element 9 in the frequency band f2. Consequently, the impedance seen from the second terminal P2 side of second matching block 80b (the first terminal P1 side of second matching block 80c) toward element 1 becomes Z0. Also, auxiliary matching block 82b is designed so that the combined impedance of second matching blocks 80c and 80d, auxiliary matching block 82b, and element 9 becomes Z0 at the frequency f2. By designing auxiliary matching block 82b in this way, the impedance seen from the first terminal P1 side of second matching block 80c (the second terminal P2 side of second matching block 80b) toward element 9 becomes Z0 at the frequency f2. Consequently, the impedances are matched.

In the case of frequency band f1, switch element 81a and second switch element 84 are conducting. First matching block 2 is designed so that the impedance of element 1 (impedance $Z_L(f2)$) is made to match the impedance Z0 of element 9 in the frequency band f1. Consequently, the impedance seen from the second terminal P2 side of first matching block 2 toward element 1 becomes Z0. Auxiliary matching block 82a and 85 are designed so that, in the frequency band f1, the combined impedance of second matching blocks 80a, 80b, 80c and 80d, auxiliary matching block 82a, and element 9 becomes Z0. Consequently, the impedance seen from the second terminal P2 side of first matching block 2 (the first terminal P1 side of second matching block 80a) toward element 9 becomes Z0.

In this way, in the case of connecting T-type matching circuits, the two second matching blocks and the auxiliary matching block only make up a set with respect to one frequency band. In order to make the second matching blocks handle a plurality of frequency bands, a plurality of auxiliary matching blocks becomes necessary.

Embodiment 6

Figure 13:
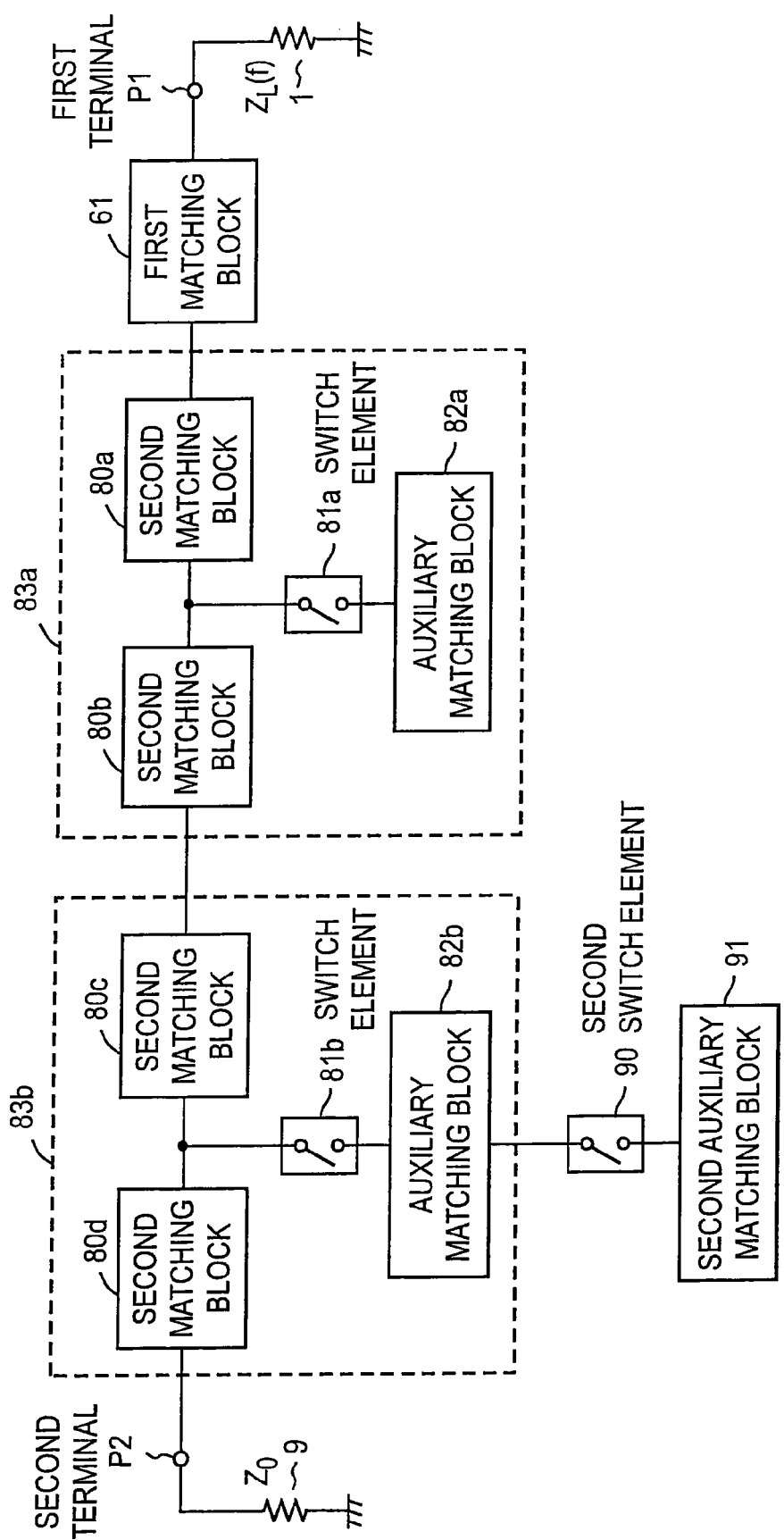
FIG. 13 is a diagram showing a configuration example of a matching circuit of the present invention, using T-type matching circuits where auxiliary matching blocks have been connected in series.

As explained in Embodiment 5, in the case of connecting T-type matching circuits, there are cases in which, for two second matching blocks, a plurality of auxiliary matching blocks becomes necessary. In FIG. 13, there is shown a configuration example of a matching circuit using an additional auxiliary matching block. FIG. 13 shows a configuration example where a second switch element 90 and a second auxiliary matching block 91 have been connected in series with auxiliary matching block 82b of FIG. 12. Having auxiliary matching blocks connected in series in two stages is done so that second matching blocks 80c and 80d constituting T-type matching circuit 83b can handle two frequency bands.

In the case of this example, in order for the circuit to function also in the case where only switch 81b is conducting, it is necessary to choose auxiliary matching block 82b to be a transmission line. In case it is not desired to provide such conditions, switch element 81b may be configured with a Single Pole Double. Throw (SPDT) switch or a multi-contact switch, and switching may be performed between auxiliary matching blocks with different values.

If the circuit configuration is such that the impedance of the second matching block inserted between element 1 and element 9 can be made Z0, seen from both the aforementioned matching point and the element 9 directions, the invention is not limited to the T type or the π type.

Embodiment 7

Figure 14:
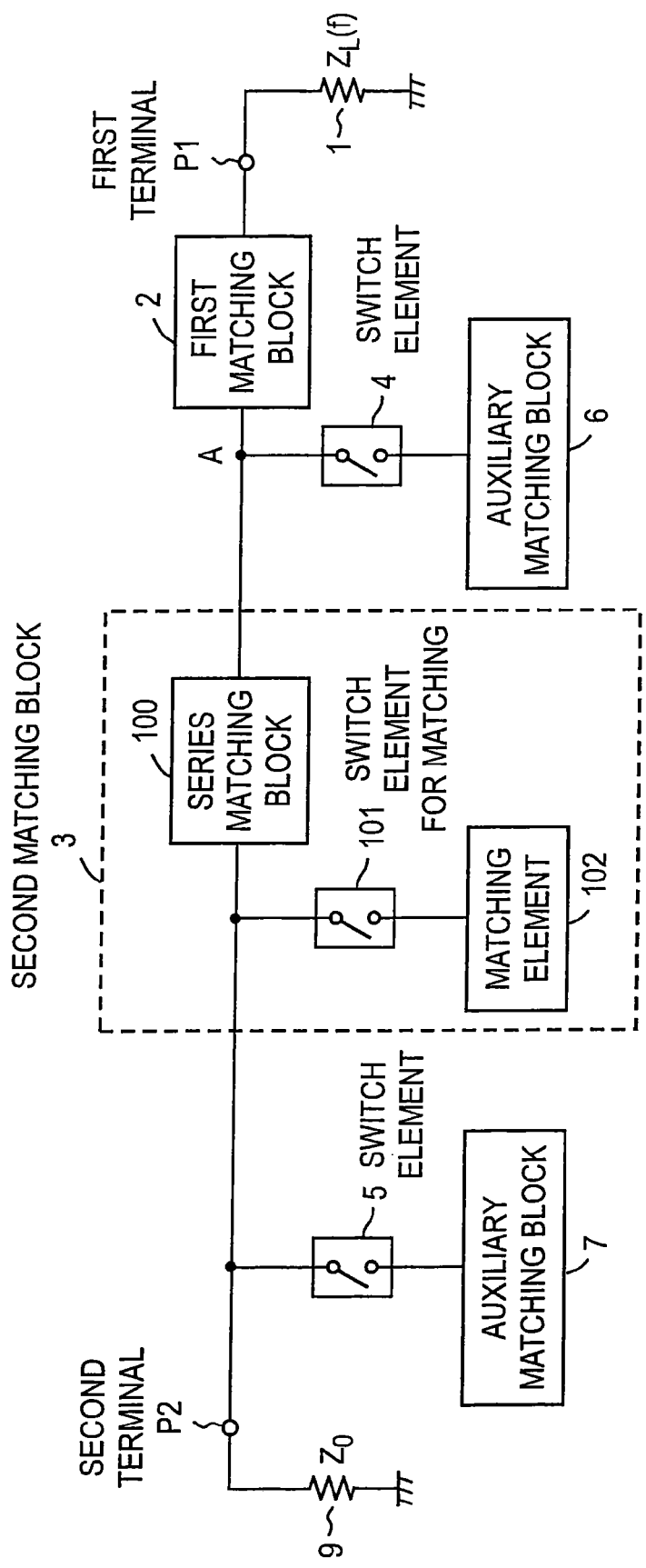
FIG. 14 is a diagram showing an example where the second matching block of FIG. 5 is configured with an L-type circuit.

In the explanations so far, the second matching blocks were explained as black boxes. In FIG. 14, there is shown a configuration example of second matching block 3 of FIG. 5. Second matching block 3 is constituted by an L-type circuit consisting of a series matching block 100, a switch element 101 for matching, and a matching element 102. One end of series matching block 100 is connected to first matching block 2. Matching element 102 is connected to the other end of series matching block 100 via switch element 101 for matching.

In the case of frequency band f1, switch elements 4 and 5 are in a non-conducting state, and only switch element 101 for matching is conducting. At this point, the sum of the impedances of element 1 and first matching block 2 are matched to impedance Z0 of element 9 by means of series matching block 100 and matching element 102.

In the case of frequency band f2, switch elements 4 and 5 are made to conduct and switch element 101 for matching is chosen to be non-conducting. As for this configuration, it is possible, by the existence of matching element 102, to broaden the options of second matching block 3 and auxiliary matching block 6 and 7. In other words, it is possible to increase the freedom in designing second matching block 3 by configuring second matching block 3 with series matching block 100, first switch element 101 for matching, and matching element 102. In general, the values of the lumped elements constituting second matching block 3 are discrete, making delicate tuning difficult. However, according to this embodiment, it is possible to broaden the lumped element options.

Embodiment 8

Figure 15:
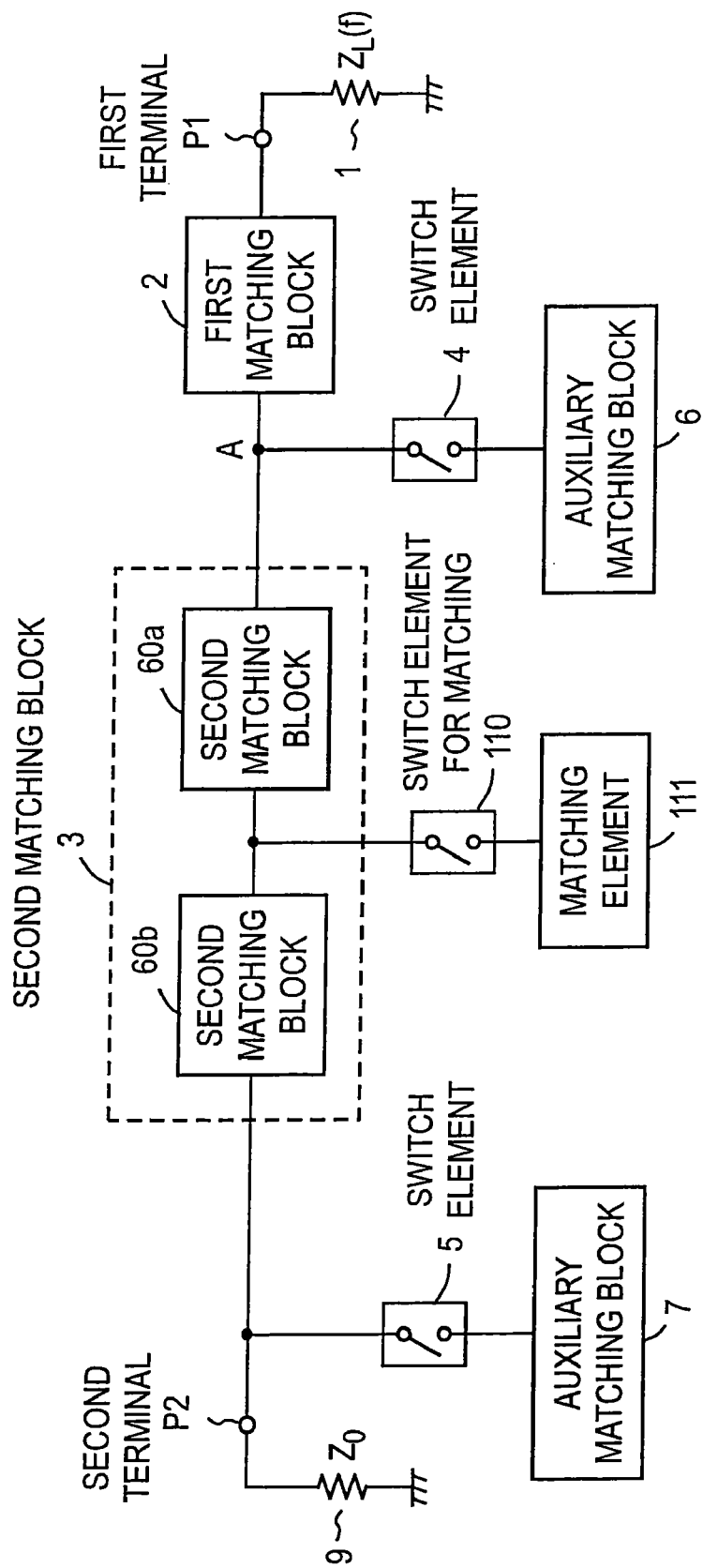
FIG. 15 is a diagram showing the configuration of the second matching block using a T-type circuit.

Another configuration of the second matching block is shown in FIG. 15. Second matching block 3 in FIG. 15 is constituted by a T-type circuit consisting of second matching blocks 60a and 60b, a switch element 110 for matching, and a matching element 111. Second matching block 60a and second matching block 60b are connected in series. One end of second matching block 60a is connected to first matching block 2. The other end of second matching block 60b is connected to second terminal P2. Matching element 111 is connected, via switch element 110 for matching, to the connection point of second matching block 60a and second matching block 60b.

Switch element 110 for matching and matching element 111 are provided in order to increase the freedom in designing the second matching blocks and auxiliary matching block 7 and auxiliary matching block 6. Regarding the function, it is the same as in Embodiment 7.

Embodiment 9

Figure 16:
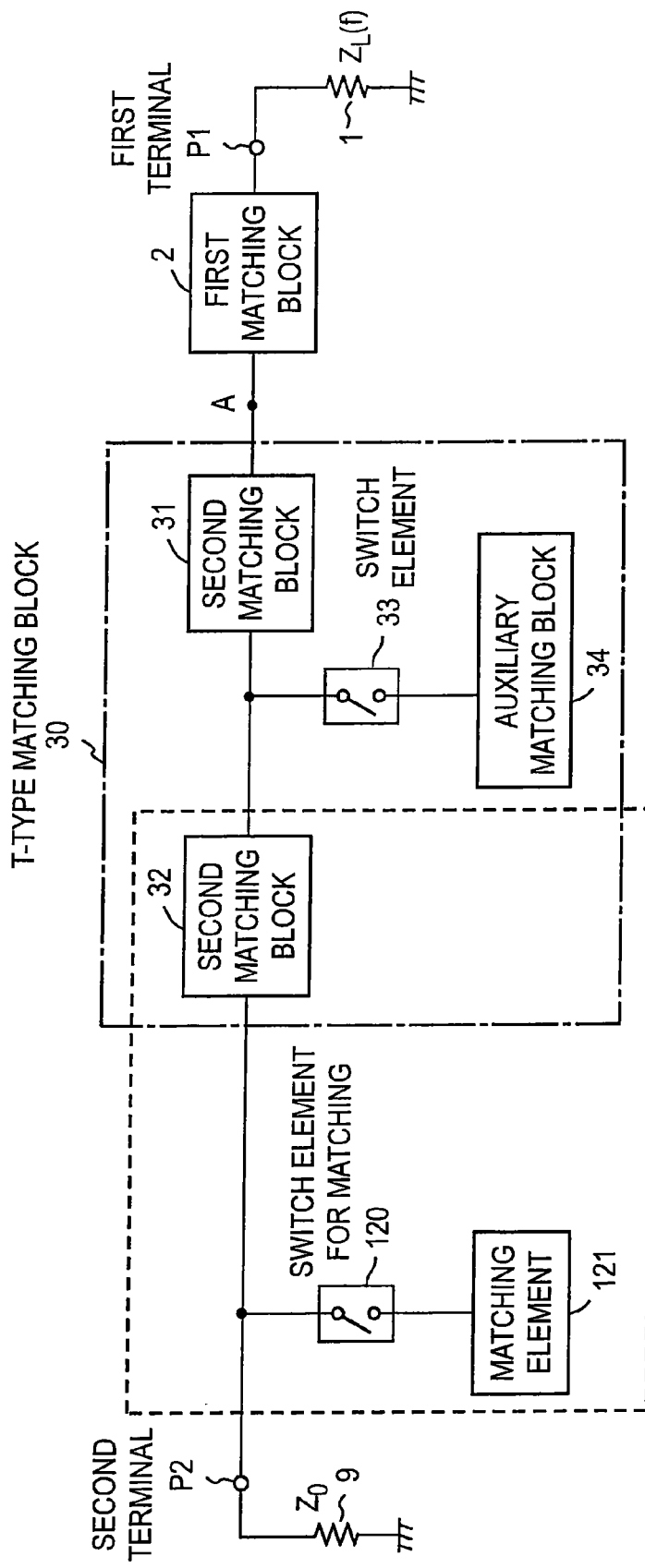
FIG. 16 is a diagram showing another configuration of the second matching block using a T-type circuit.

Another configuration of the second matching blocks is shown in FIG. 16. FIG. 16 differs from FIG. 7 in the point that, on the second terminal P2 side of T-type matching circuit part 30, there are provided a switch element 120 form matching and a matching element 121. In the case of frequency f2, switch element 33 and switch element 120 for matching are e.g. made to conduct exclusively. Matching element 121 and second matching block 31 and 32 are designed so that the combined impedance with element 1 and first matching block 2 is chosen to be Z0. By configuring the circuit in this way, it is possible to increase the freedom in designing the second matching blocks.

Embodiment 10

Figure 17:
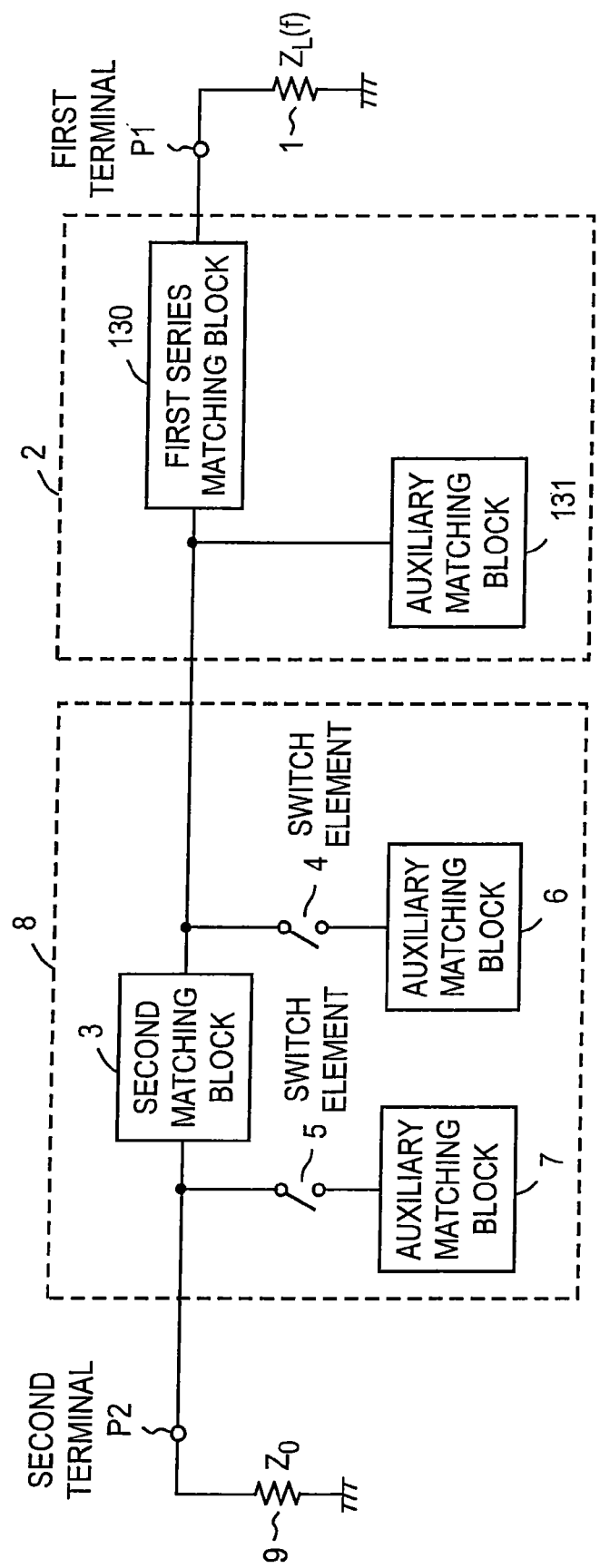
FIG. 17 is a diagram showing an example where the first matching block has been configured with a plurality of elements.

In the same way as configuring second matching block 3 by using a plurality of elements, first matching block 2 may also be configured with a plurality of elements. A configuration example thereof is shown in FIG. 17. In this example, first matching block 2 is composed of a first series matching block 130 and an auxiliary matching block 131 connected to one end thereof. Further, auxiliary matching block 131 may be connected to either end of first series matching block 130. First series matching block 130 is connected to element 9 via matching circuit part 8.

As for the configuration of the first matching block, modes other than this are possible. All things considered, in a predetermined frequency band f, if the impedance seen from point A toward element 1 (impedance $Z_L(f)$) can be chosen to be Z0, any circuit configuration is acceptable.

Application Example

Figure 18:
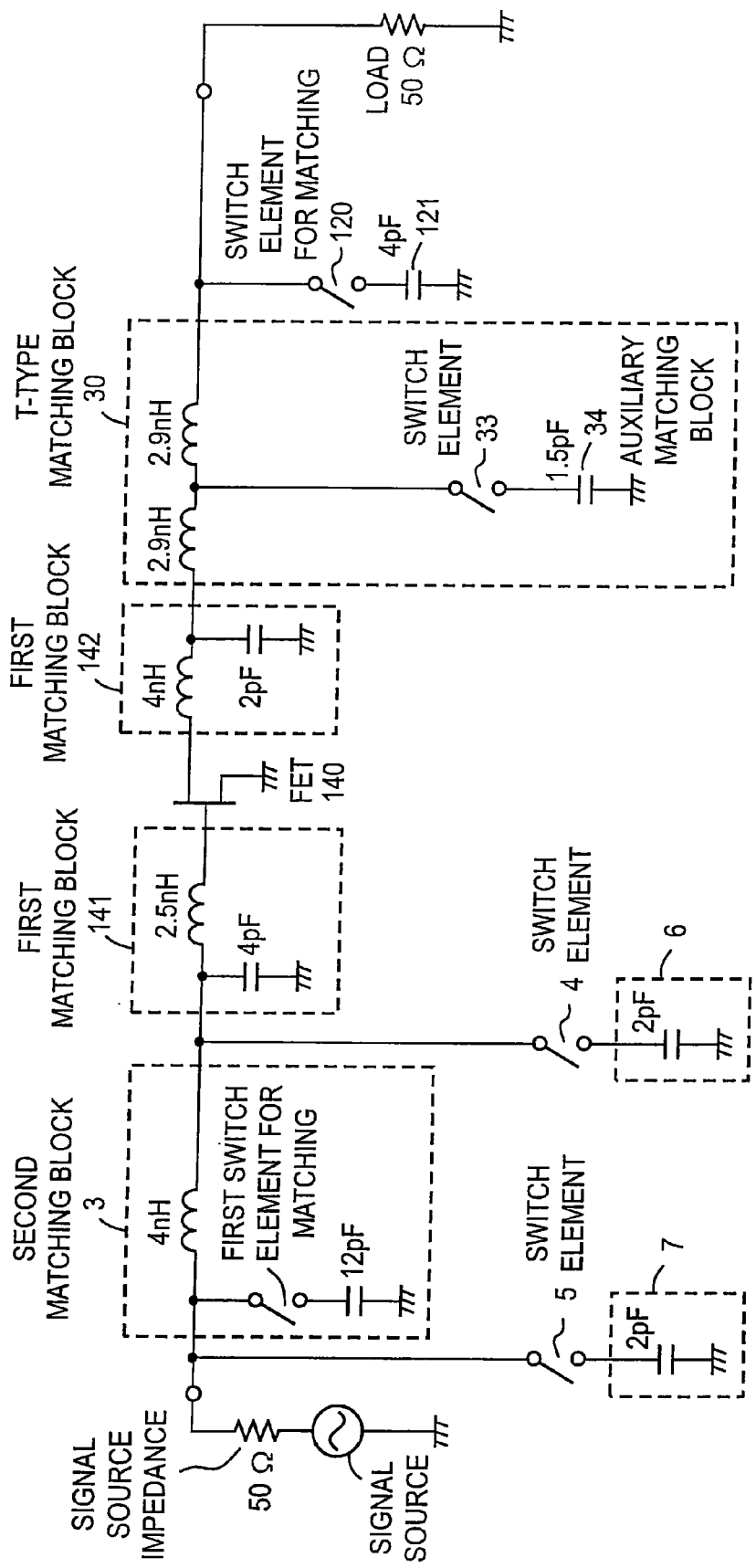
FIG. 18 is a diagram showing an example where a matching circuit of this invention has been applied to an amplification circuit.

An exemplification of the matching circuit which has been gradually explained this far is shown in FIG. 18. FIG. 18 is an example applied to an amplifying circuit operating in two frequency bands, the 2 GHz band and the 1 GHz band. On the input side of an FET 140, which is a power amplifier element, the matching circuit shown in FIG. 17 is connected, and on the input side, the matching circuit shown in FIG. 16 is connected. As for the matching circuit on the input side, first matching block 2 has become a first matching block 141. The output side matching circuit has, based on the matching circuit shown in FIG. 16, first matching block 2 configured with a first matching block 142.

Figure 19A:
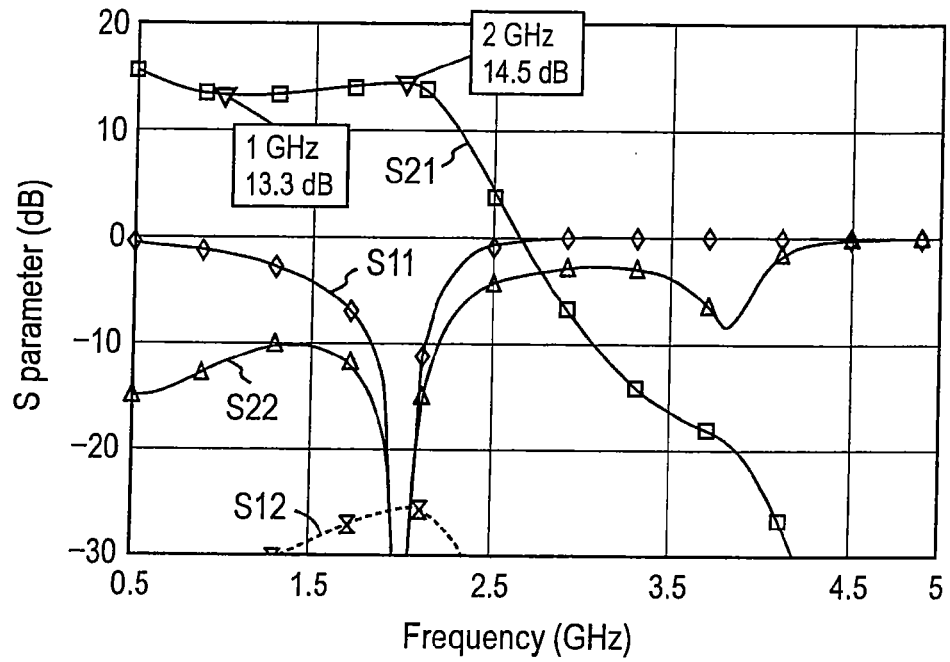
FIG. 19A is a diagram showing the simulation results in the case of a setting for the 2 GHz band, with the configuration of FIG. 18.
Figure 19B:
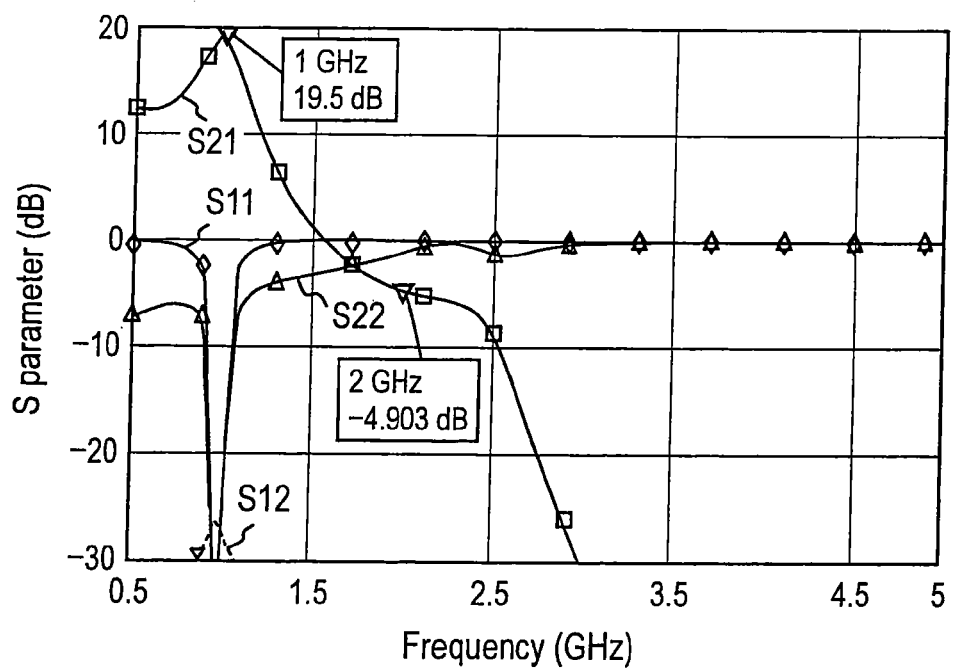
FIG. 19B is a diagram showing the simulation results in the case of a setting for the 1 GHz band, with the configuration of FIG. 18.

The operation has been explained this far, so an explanation thereof will be omitted. In FIG. 19A and FIG. 19B, the simulation results for the amplifier in FIG. 18 are shown. FIG. 19A is a diagram showing the frequency characteristics in the case where the circuit has been set for the 2 GHz band. The abscissa axis indicates the frequency and the ordinate axis indicates the S parameter. The reflection $S_{11}$ of the signal input into first terminal P1 gets attenuated abruptly at 2 GHz. The transmission $S_{21}$ of the signal input in first terminal P1 exhibits a value of approximately 14 dB at 2 GHz, so the circuit transmits well. FIG. 19B is a diagram showing the frequency characteristics in the case where the circuit has been set for the 1 GHz band. The reflection $S_{11}$ of the signal input into first terminal P1 gets attenuated abruptly at 1 GHz. The transmission $S_{21}$ of the signal input in first terminal P1 exhibits a value of approximately 19 dB at 1 GHz, so the circuit transmits well. It is seen that the matching circuit according to the present invention functions as a multiband matching circuit.

The matching circuit according to the present invention has an impedance seen from both ends of a second matching block, inserted between element 9 and element 1 and formed with lumped-parameter elements, which is made to match the impedance Z0 by means of an auxiliary matching block. Also, by raising the number of auxiliary matching blocks, a matching circuit handling a plurality of frequency bands is adopted. Further, since the second matching block is formed with lumped elements, it can be made smaller than prior-art matching circuits configured with transmission lines.

Figure 1:
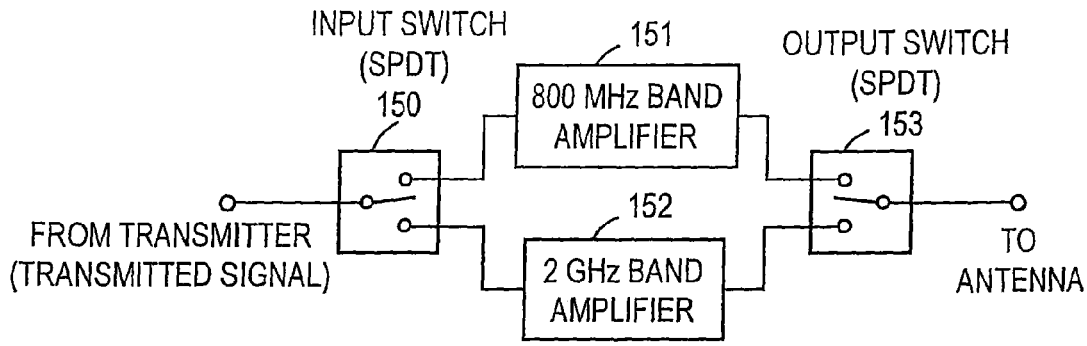
FIG. 1 is a diagram showing the configuration of a conventional 800 MHz/2 GHz band power amplifier
Figure 2:
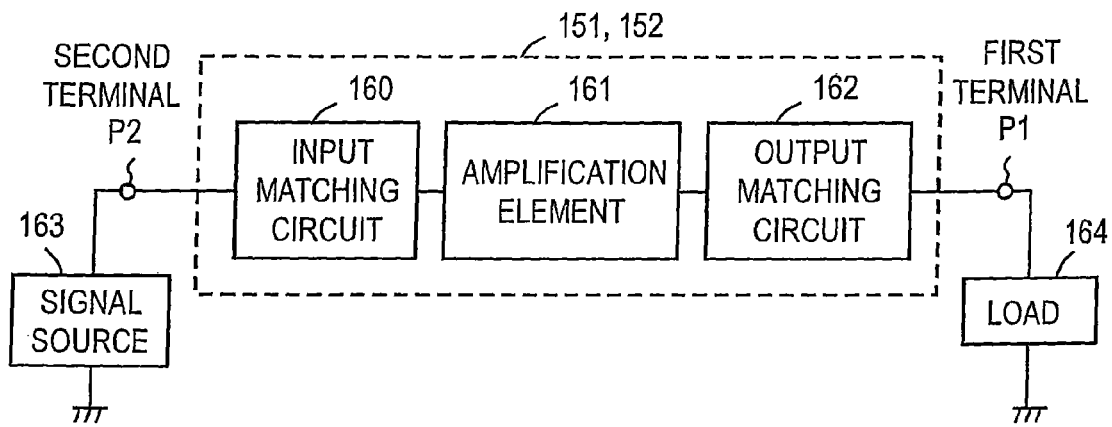
FIG. 2 is a diagram showing the configuration of each power amplifier in FIG. 1.
Figure 3:
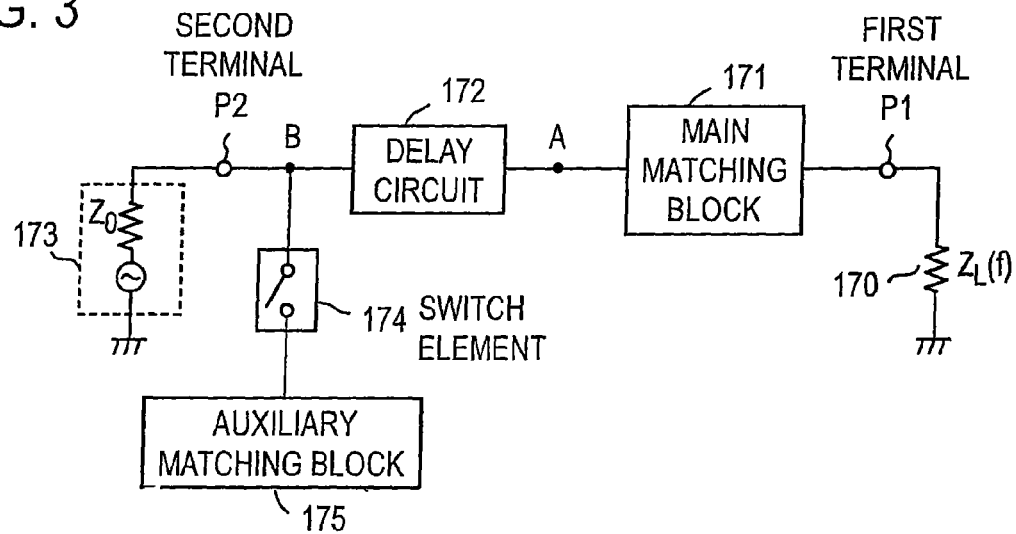
FIG. 3 is a diagram showing a conventional matching circuit.
Figure 4:
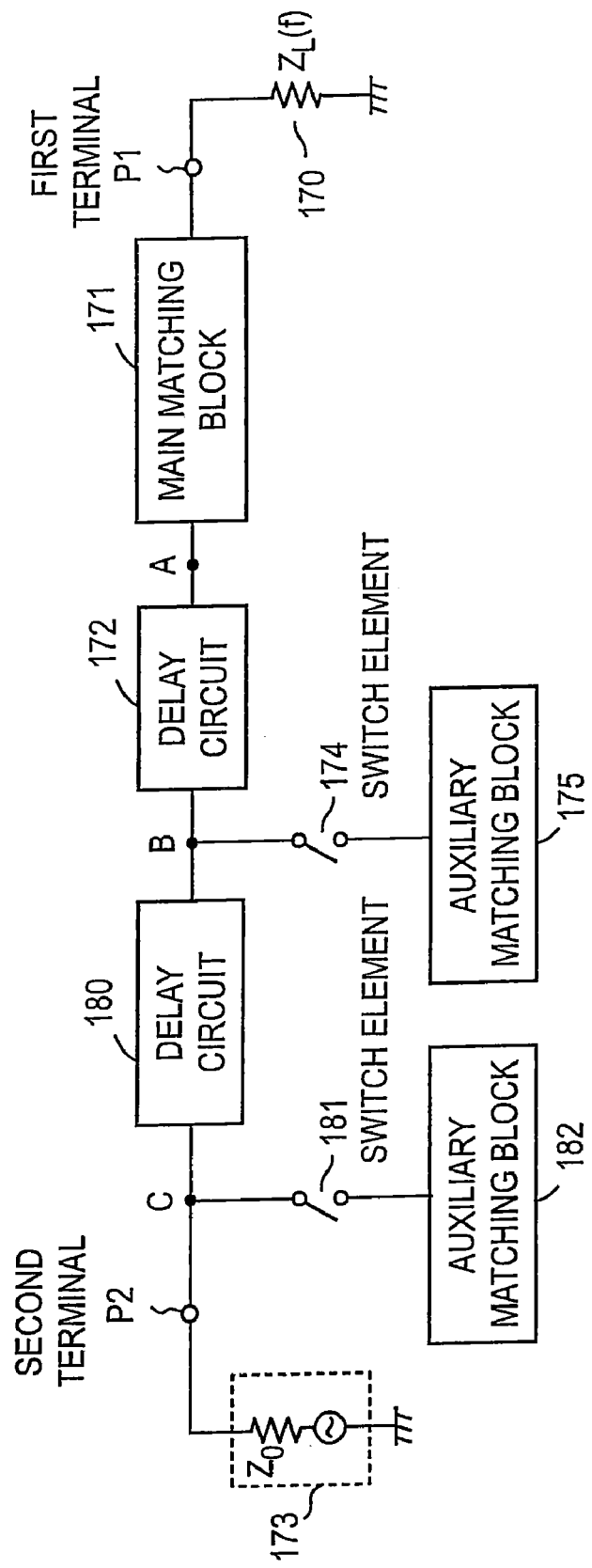
FIG. 4 is a diagram showing an example where the number of frequency bands which can be handled by the conventional matching circuit has been taken to be three.

The effect of the reduction in size is possible to see by comparing FIG. 3 showing a conventional matching circuit and FIG. 5 showing the matching circuit of the present invention. FIG. 3 and FIG. 5 are diagrams of circuits made capable of matching in two frequency bands together. As against the conventional matching circuit (FIG. 3), the matching circuit of the present invention (FIG. 5) requires in total two additional components, one switch element and one auxiliary matching circuit. However, the delay circuit 172 required in the conventional matching circuit is a large-size component. The size thereof varies with the frequency band and the used power amplification element, but when e.g., the frequency band is taken to be 1 GHz with a certain amplification element, the width is 0.63 mm and the length is 9.22 mm, or the length is 15.32 mm.

On the other hand, the matching circuit of the present invention can be configured with a chip circuit commonly known by the name 0603 and having a width of 0.3 mm and a length of 0.6 mm and a Monolithic Microwave Integrated Circuit several mm square. In other words, all of the components constituting the matching circuit of the present invention end up amply fitting into the space of delay circuit 172. In order to handle still more frequency bands, the number of delay circuits 172 must be increased. Consequently, as a matching circuit for multiband use, the matching circuit of the present invention can be further reduced in size, compared to a conventional matching circuit.

What is claimed is:

1. A matching circuit making the impedance at predetermined N+1 frequencies match with a frequency-dependent element whose impedance has frequency-dependent characteristics, comprising:

a first matching block connected at one end to a first terminal to which the frequency-dependent element is connected;

N second matching blocks including lumped elements and connected in series to said first matching block;

N L-type circuits each including one of said second matching blocks and a series circuit of one of first switch elements connected to one end of said one second matching block, and one of first auxiliary matching blocks; and N shunt circuit block parts, each including a series circuit of one of second switch elements and one of second auxiliary matching blocks, wherein, N is an integer equal to or greater than 1, said N L-type circuits have one end of a second matching block of a first L-type circuit connected in series to said first matching block and one end of a second matching block of a next-stage L-type circuit connected to another end of said second matching block of the first L-type circuit, said N shunt circuit block parts are connected to one end of a second matching block of a last-stage L-type circuit, a π-type circuit is formed by said one second auxiliary matching block connected to said one second switch element made to conduct, said one first auxiliary matching block connected to said one first switch element made to conduct, and the second matching blocks between these, for matching at an N+1-th frequency, said first switch elements and said second switch elements are all in a non-conducting state, and N-th second matching block is designed so that a combined impedance of the frequency-dependent element, said first matching block, and said N second matching blocks is matched to a predetermined impedance, for matching at an n-th frequency (n=N to 2), one of said first switch elements of an n-th L-type circuit and one of said second switch elements of an n-th shunt circuit are chosen to be in a conducting state, n−1-th second matching block is designed so that a combined impedance of the frequency-dependent element, said first matching block, and n−1 of said second matching blocks which are from a first of said second matching blocks to an n−1-th of said second matching blocks is matched to the predetermined impedance, and one of said first auxiliary matching blocks of the n-th L-type circuit and one of said second auxiliary matching blocks of the n-th shunt circuit are designed so that a combined impedance of one of said first auxiliary matching blocks of the n-th L-type circuit, one of said second auxiliary matching blocks of the n-th shunt circuit, and N−n+1 of said second matching blocks which are from the n-th of said second matching blocks to the N-th of said second matching blocks is matched to the predetermined impedance, and for matching at the first frequency, one of said first switch elements of the first L-type circuit and one of said second switch elements of a first shunt circuit are chosen to be in a conducting state, said first matching block is designed so that the combined impedance of the frequency-dependent element, and said first matching block is matched to the predetermined impedance, and one of said first auxiliary matching blocks of the first L-type circuit and one of said second auxiliary matching blocks of the first shunt circuit are designed so that the combined impedance of one of said first auxiliary matching blocks of the first L-type circuit, one of said second auxiliary matching blocks of the first shunt circuit, and N of said second matching blocks is matched to the predetermined impedance.

2. The matching circuit according to claim 1, wherein N equals 1.

3. The matching circuit according to claim 1 or 2, wherein said second matching block is constituted by an L-type circuit including a series matching block and a series circuit of a switch element, connected to said series matching block, and a matching element.

* * * * *